(12) United States Patent
Yuasa et al.

(10) Patent No.: US 10,405,468 B2
(45) Date of Patent: Sep. 3, 2019

(54) SHIELD CASE AND ELECTRONIC DEVICE

(71) Applicant: Toshiba Client Solutions CO., LTD., Koto-ku, Tokyo (JP)

(72) Inventors: Tomokazu Yuasa, Akishima Tokyo (JP); Hideo Shirasaka, Ome Tokyo (JP)

(73) Assignee: Toshiba Client Solutions Co., Ltd., Tokyo (JP)

( * ) Notice: Subject to any disclaimer, the term of this patent is extended or adjusted under 35 U.S.C. 154(b) by 0 days.

(21) Appl. No.: 15/953,682

(22) Filed: Apr. 16, 2018

(65) Prior Publication Data
US 2018/0359884 A1 Dec. 13, 2018

(30) Foreign Application Priority Data
Jun. 8, 2017 (JP) .................................. 2017-113543

(51) Int. Cl.
| | |
|---|---|
| H05K 1/02 | (2006.01) |
| H05K 1/18 | (2006.01) |
| H05K 7/20 | (2006.01) |
| H05K 9/00 | (2006.01) |
| H01L 23/36 | (2006.01) |
| H01L 23/367 | (2006.01) |
| H01L 23/373 | (2006.01) |
| H01L 23/552 | (2006.01) |

(52) U.S. Cl.
CPC ........... *H05K 9/0032* (2013.01); *H01L 23/36* (2013.01); *H01L 23/3675* (2013.01); *H01L 23/3733* (2013.01); *H01L 23/552* (2013.01); *H05K 1/0203* (2013.01); *H05K 1/181* (2013.01); *H05K 7/20454* (2013.01); *H05K 2201/10371* (2013.01)

(58) Field of Classification Search
CPC ............................................. H05K 2201/10371
USPC ........................................................... 361/816
See application file for complete search history.

(56) References Cited

U.S. PATENT DOCUMENTS

| | | | | |
|---|---|---|---|---|
| 6,181,573 B1 * | 1/2001 | Riet | ..................... | H05K 9/0032 174/353 |
| 6,872,880 B2 * | 3/2005 | King | ..................... | H05K 9/0033 174/372 |
| 7,109,411 B2 * | 9/2006 | Vinokor | ............... | H05K 9/0032 174/350 |
| 7,623,360 B2 * | 11/2009 | English | ................ | H05K 9/0032 361/800 |
| 7,724,542 B2 * | 5/2010 | Gallahan | .............. | H05K 9/0032 361/816 |
| 7,876,579 B1 * | 1/2011 | Tsau | ..................... | H05K 9/0032 361/816 |
| 7,916,500 B2 * | 3/2011 | Shi | ........................ | H05K 9/0032 174/350 |

(Continued)

FOREIGN PATENT DOCUMENTS

| | | |
|---|---|---|
| JP | H02170593 A | 7/1990 |
| JP | 2002368481 A | 12/2002 |
| JP | 2009182058 A | 8/2009 |

*Primary Examiner* — Lisa Lea-Edmonds
(74) *Attorney, Agent, or Firm* — Rutan & Tucker, LLP

(57) ABSTRACT

According to one embodiment, a shield case includes a frame configured to surround an electronic component and including a contact portion at a top of the frame, and a cover including a side plate and a top plate, a groove being formed at a peripheral portion of the top plate. The side plate is outside the frame and the groove contacts the contact portion when the cover is engaged with the frame.

15 Claims, 5 Drawing Sheets

(56) References Cited

U.S. PATENT DOCUMENTS

| | | | | |
|---|---|---|---|---|
| 8,284,569 B2* | 10/2012 | Yamazaki | ............ | H05K 9/0032 |
| | | | | 174/350 |
| 8,542,498 B2* | 9/2013 | Su | ........................ | H05K 9/0032 |
| | | | | 361/816 |
| 8,570,766 B2* | 10/2013 | Noguchi | .............. | H05K 9/0009 |
| | | | | 361/641 |
| 2008/0000683 A1* | 1/2008 | Vinokor | ............... | H05K 9/0032 |
| | | | | 174/382 |
| 2009/0190321 A1 | 7/2009 | Yamazaki et al. | | |

* cited by examiner

SHIELD CASE AND ELECTRONIC DEVICE

CROSS-REFERENCE TO RELATED APPLICATIONS

This application is based upon and claims the benefit of priority from Japanese Patent Application No. 2017-113543, filed Jun. 8, 2017, the entire contents of which are incorporated herein by reference.

FIELD

Embodiments described herein relate generally to a shield case which covers an electronic component and an electronic device including the shield case.

BACKGROUND

An electronic component usually generates unwanted electromagnetic waves. Therefore, a shield case which covers the electronic component is used to block the unwanted electromagnetic waves. In general, a shield case which has a frame surrounding an electronic component and is attached to a substrate and has a cover attached to the frame is known.

BRIEF DESCRIPTION OF THE DRAWINGS

A general architecture that implements the various features of the embodiments will now be described with reference to the drawings. The drawings and the associated descriptions are provided to illustrate the embodiments and not to limit the scope of the invention.

DETAILED DESCRIPTION

In general, according to one embodiment, a shield case includes a frame configured to surround an electronic component and comprising a contact portion at a top of the frame; and a cover comprising a side plate and a top plate, a groove being formed at a peripheral portion of the top plate. The side plate is outside the frame and the groove contacts the contact portion when the cover is engaged with the frame.

Various embodiments will be described hereinafter with reference to the accompanying drawings.

First Embodiment

Figure 1:
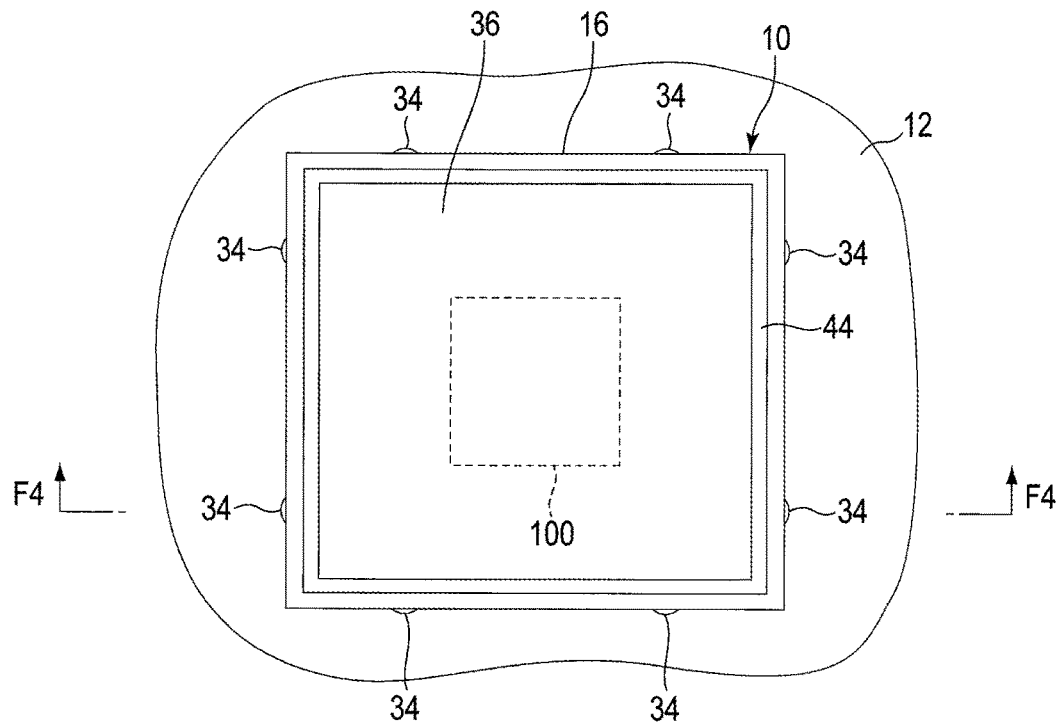
FIG. 1 is a plan view of a shield case.

FIG. 1 is a plan view of a shield case of a first embodiment. As shown in FIG. 1, an electronic component, such as a CPU 100 is provided on a substrate 12. A shield case 10 is provided on the substrate 12 to cover the CPU 100. The substrate 12 is included, in a notebook computer as an electronic device, for example. In the following, for the sake of convenience of explanation, one surface of the substrate 12 on which the CPU 100 is provided is called the upper surface of the substrate 12, and the other surface is called the lower surface. Further, with reference to a region surrounded by the shield case 10, a direction from the outside of the region toward the region is assumed to be an inward direction, and an opposite direction is assumed to be an outward direction.

The CPU 100 is an electronic component which radiates electromagnetic waves and generates heat in association with operations. In the present embodiment, the electronic device is not limited to a notebook computer, and the electronic component is not limited to a CPU.

Figure 2:
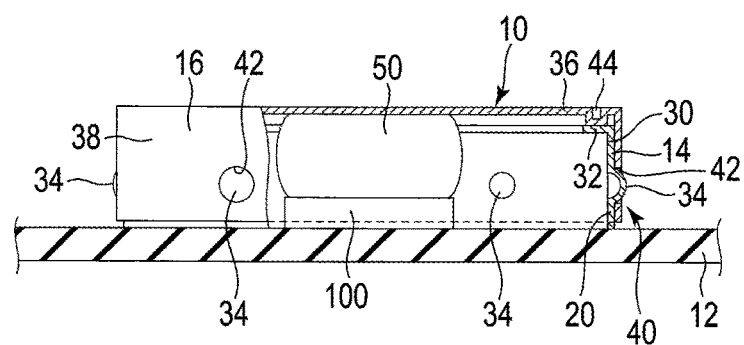
FIG. 2 is a sectional view where a part of the shield case is cut away.

FIG. 2 is a sectional view where a part of the shield case 10 is cut away. As shown in FIGS. 1 and 2, the shield case 10 is substantially a flat rectangular parallelepiped as a whole and includes a frame 14 and a cover 16. The cover 16 is to be attached to the frame 14. The frame 14 and the cover 16 are formed of a metal material having high thermal conductivity, high electric conductivity, and high magnetic permeability, such as aluminum, an aluminum alloy and a copper material, for example. The frame 14 and the cover 16 are not necessarily formed of the same material and may be formed of different materials from each other.

Figure 3:
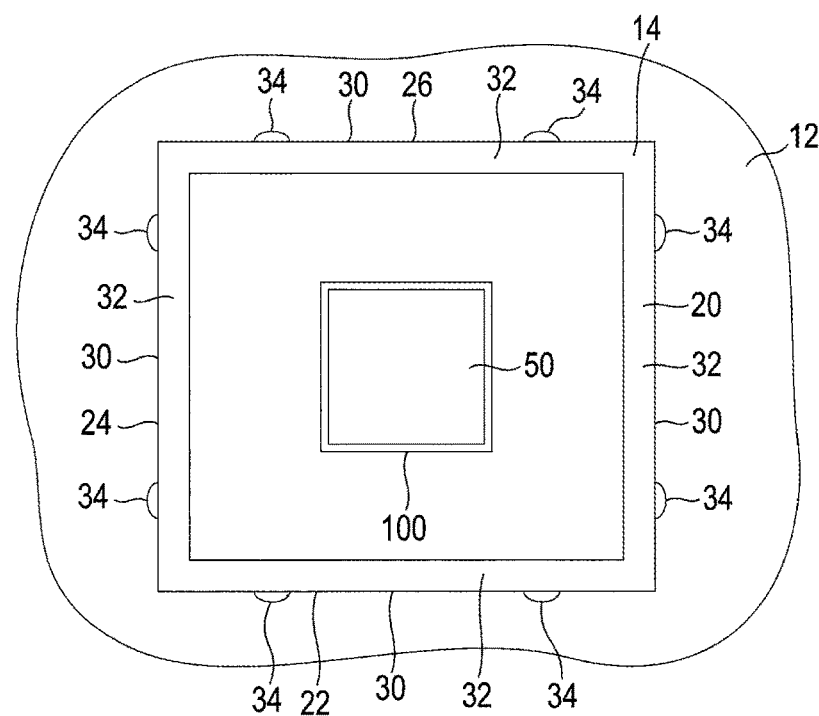
FIG. 3 is a plan view of a frame.

FIG. 3 is a plan view of the frame 14. As shown in FIG. 3, the frame 14 includes a first wall 20, a second wall 22, a third wall 24 and a fourth wall 26. The first wall 20 and the third wall 24 are opposed to each other. The second wall 22 and the fourth wall 26 are opposed to each other. The first wall 20 is perpendicularly and integrally connected to the second wall 22. The second wall 22 is perpendicularly and integrally connected to the third wall 24. The third wall 24 is perpendicularly and integrally connected to the fourth wall 26. The frame 14 basically has four sides of the walls and has a rectangular or square shape. The CPU 100 is arranged substantially at the center of the rectangle or square of the frame 14. Note that the shape of the frame 14 is not limited to this shape.

Figure 4:
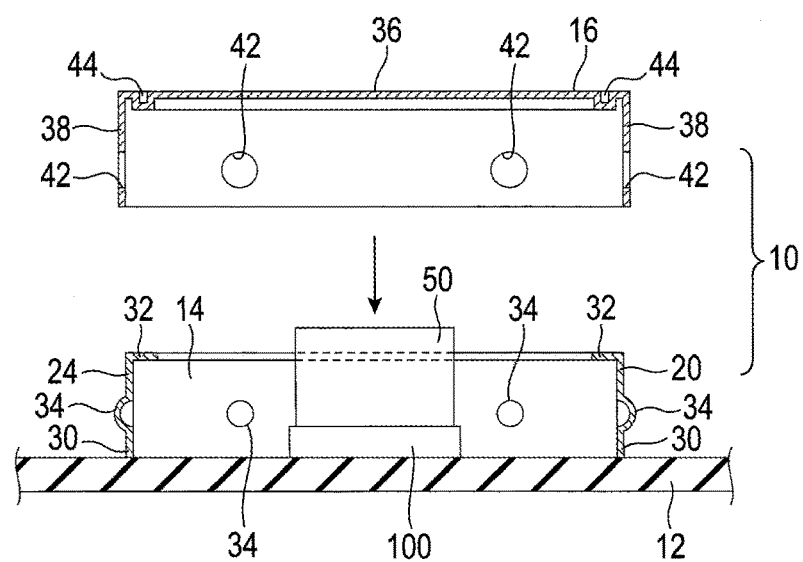
FIG. 4 is a sectional view of the shield case taken along section line F4-F4 of FIG. 1.

FIG. 4 is an exploded sectional view of the shield case 10 taken along line F4-F4 of FIG. 1. As shown in FIG. 4, the first wall 20 includes a side plate 30 and a groove contact portion 32. The upper end of the side plate 20 is bent toward the inside of the frame 14 to form the groove contact portion 32. Therefore the first wall 20 has a reversed L shape.

Since all the walls 20, 22, 24, and 26 basically have the same shape, the first wall 20 will be mainly described below, and description of the first wall 20 will be substituted for descriptions of the other walls 22, 24, and 26.

A lower end of the side plate 30 is fixed to the upper surface of the substrate 12, for example, by means of soldering. The side plate 30 has the constant height, and an upper end thereof is parallel to the upper surface of the substrate 12. Further, all the side plates 30 of the first wall 20 to the fourth wall 26 have the same height, and upper ends thereof are parallel to the upper surface of the substrate 12.

A projection 34 which projects outward is formed in the outer surface of the side plate 30. The projection 34 is formed in a substantially spherical shape by means of pressing, for example. A hole 42 is formed in the cover 16, which will be described later. The projection 34 is engaged with or inserted in the hole 42 when the cover 16 is engaged with the frame 14. The projection 34 and the hole 42 form an engagement portion 40 which will be described later.

The groove contact portion 32 extends from the upper end of the side plate 30 to the inside of the frame 14 at a predetermined width. The groove contact portion 32 is formed parallel to the substrate 12, and basically has the same width at any position and continuously extends around the entire periphery of the frame 14 as shown in FIG. 3. A groove 44 is formed at the peripheral portion of the cover 16 which will be described later. The groove 44 contacts the groove contact portion 32 when the cover 16 is engaged with the frame 14.

The cover 16 includes a top plate 36 and four side plates 38. The top plate 36 has the shape of a flat plate and is formed in such a manner as to correspond to the side plates 30 of the frame 14. The side plates 38 are provided along the peripheral edges of the top plate 36 substantially perpendicularly to the top plate 36.

When the cover 16 is attached to the frame 14, the side plates 38 are tightly fitted with the outsides of the side plates 30 without substantially any space. Further, the side plate 38 has such a length that a lower end thereof reaches the vicinity of the substrate 12 when the cover 16 is attached to the frame 14.

As shown in FIG. 4, the hole 42 is formed in the side plate 38. The hole 42 is formed in a position corresponding to the projection 34 of the side plate 30 and constitutes the other part of the engagement portion 40. If the hole 42 is accurately engaged with the projection 34, the cover 16 is attached to the frame 14 at a designed position, and consequently the cover 16 and the frame 14 are securely attached to each other.

Note that the projection 34 may be provided at the side plate 38 of the cover 16 and the hole 42 may be provided at the side plate 30 of the frame 14. Further, the hole 42 may be a recess which is engaged with the projection 34. Further, the engagement portion 40 does not necessarily have this structure and may have any structure as along as the cover 16 and the frame 14 can be securely attached to each other. The grooves 44 are provided at the outer peripheral edge portions of the top plate 36.

The grooves 44 are formed respectively in the four sides of the top plate 36 as shown in FIG. 1. The groove 44 has a rectangular cross-sectional shape and a constant depth as shown in FIG. 2, etc. The grooves 44 of the respective sides are continuously formed, and will contact upper surfaces of the groove contacts 32 when the cover 16 is securely attached to the frame 14, that is, the projections 34 are engaged with the holes 42 and the engagement portions 40 are accurately engaged.

A bottom of the groove 44 should preferably be a flat surface but may be a curved surface. Further, the groove 44 may be formed not continuously but may be formed intermittently as a plurality of grooves.

Figure 5:
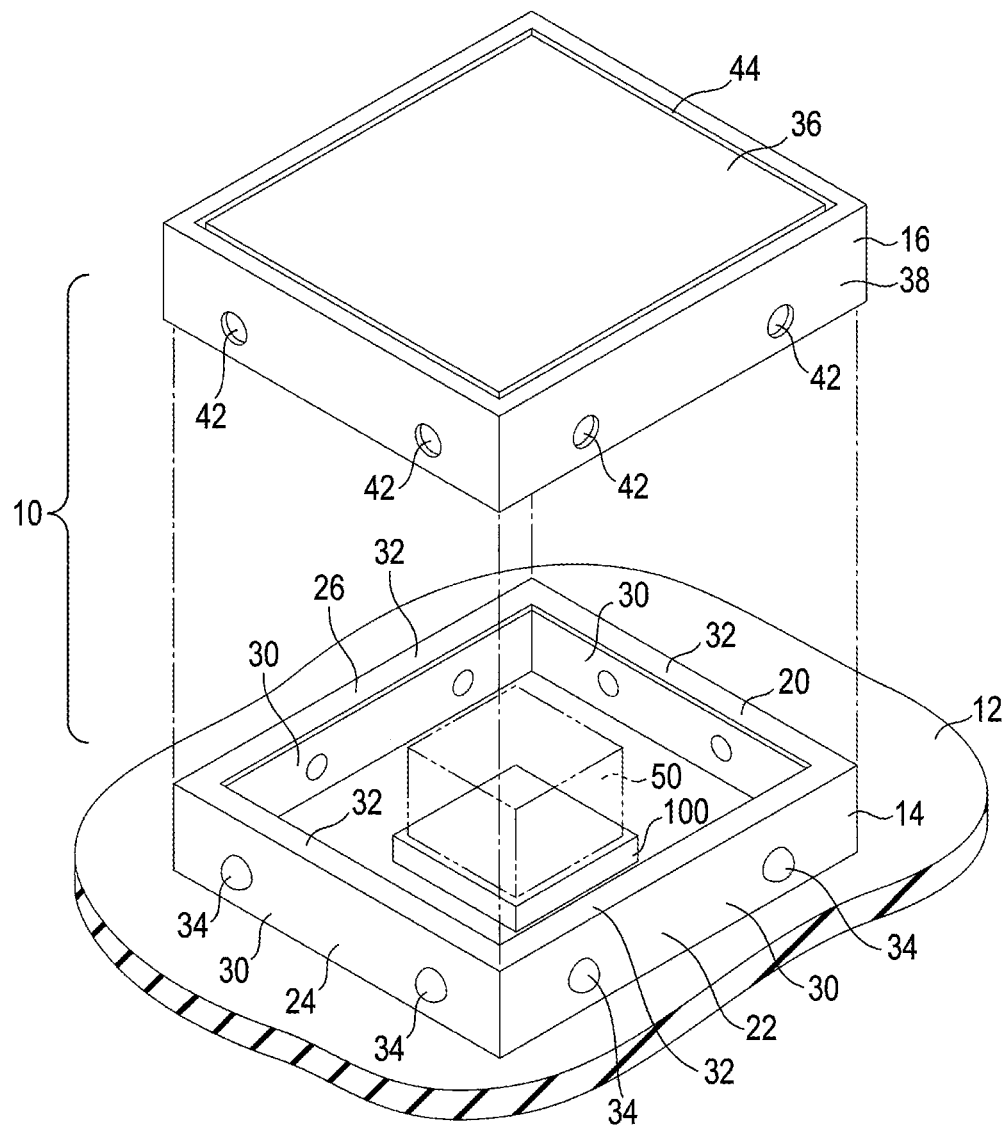
FIG. 5 is a perspective view of the shield case obliquely viewed from above.

FIG. 5 is a perspective view of the shield case 10 when obliquely viewed from above. As shown in FIG. 5, a heat-transfer member 50 is provided on an upper surface of the CPU 100. The heat-transfer member 50 is formed of a material having high thermal conductivity and elasticity such as a foamable metal material, for example. The heat-transfer member 50 is attached to the upper surface of the CPU 100 with an adhesive agent having high thermal conductivity.

A height of the heat-transfer member 50 in a normal state (a state free from compression or extension) (shown in FIG. 4) is greater than a height from the CPU 100 to the top plate 36 when cover 16 is attached to the frame 14.

Therefore, when the cover 16 is attached to the frame 14, as shown in FIG. 2, the heat-transfer member 50 contacts substantially the center of the top plate 36 in a state of being compressed in the vertical direction, and further compression stress from the heat-transfer member 50 is applied to the engagement portions 40. Note that the heat-transfer member 50 may be attached to the cover 16 instead. Alternatively, the heat-transfer member 50 may be simply placed on the CPU 100.

Next, a function and an effect of the shield case 10 will be described. The CPU 100 and the frame 14 of the shield case 10 are provided on the substrate 12. The frame 14 is attached to the substrate 12 in such a manner as to surround the CPU 100. A lower portion of the frame 14 is attached to the substrate 12 by means of soldering, etc. In an upper portion of the frame 14, the groove contact portions 32 are continuously provided at the same height. The heat-transfer member 50 which is higher than the side plate 30 is attached to the upper surface of the CPU 100 with an adhesive agent.

Further, the cover 16 is attached to an upper surface of the frame 14, and the cover 16 is pushed to the frame 14 until the holes 42 are engaged with the projections 34. Accordingly, the engagement portions 40 are engaged, and the cover 16 is fixed to the frame 14.

In the shield case 10, the cover 16 and the frame 14 are tightly engaged with each other as shown in FIG. 2. Further, the bottoms of the grooves 44 contact the groove contact portions 32, and the side plates 30 of the frame 14 and the top plate 36 of the cover 16 tightly contact each other. Still further, the heat-transfer member 50 provided on the CPU 100 is slightly compressed in the vertical direction and tightly contacts a lower surface of the top plate 36. Consequently, the CPU 100 is sealed with the shield case 10 and is thermally connected to the cover 16 via the heat-transfer member 50.

It is assumed that the electronic device is operated and unwanted electromagnetic waves are generated from the CPU 100, for example. The generated electromagnetic waves are absorbed by the shield case 10 formed of a metal material and will not be radiated to the outside of the shield case 10. Further, in the shield case 10, since bottom surfaces of the grooves 44 contact the upper surfaces of the groove contact portions 32 around the entire periphery of the frame 14, leakage of the electromagnetic waves can be prevented more reliably.

Further, the heat generated in the CPU 100 is transferred from the CPU 100 to the heat-transfer member 50 and is further transferred from the heat-transfer member 50 to the top plate 36 of the shield case 10. The top plate 36 is large in area and sufficiently absorbs the heat generated from the CPU 100, and the absorbed heat is radiated from the surface of the top plate 36 and heats air coming into contact with the surface. Accordingly, the CPU 100 is efficiently cooled, and a temperature thereof is suppressed within a predetermined temperature range.

Still further, as the grooves 44 are provided on an upper surface of the cover 16 along an outer periphery of the cover 16, stiffness of the top plate 36 is increased. Although the top plate 36 is always pushed upward by a repulsive force from the compressed heat-transfer member 50, since the grooves 44 are provided, stiffness is increased, and thus large deformations will not occur.

Therefore, the pressure from the heat-transfer member 50 which is applied substantially to the center of the top plate 36 is applied as a stress corresponding to a contact portion between the hole 42 of the side plate 38 and the projection 34 of the side plate 30, which constitute the engagement portion 40. Therefore, attachability in the engagement portion 40 is further improved.

Accordingly, connection states of all the engagement portions 40 in the shield case 10 are appropriately maintained. Therefore, contact resistance between the top plate 36 and the frame 14 is set to a predetermined resistance around the entire periphery of the frame 14. Therefore, in the shield case 10, an electric connection state between the frame 14 and the cover 16 is maintained to be an initial state, and unexpected leakage of electromagnetic waves (noise) from the shield case 10 is prevented.

Since the deformation of the top plate 36 is suppressed by the groove 44, a compression state of the heat-transfer member 50 is maintained to be in an initial state for a long time. Therefore, the pressure from the heat-transfer member 50 will not be reduced, and the heat-transfer effect of the heat-transfer member 50 can be excellently maintained. Therefore, excessive heat of the CPU 100 will be reliably prevented.

Further, since the cover 16 and the frame 14 are engaged with each other in the engagement portion 40, the cover 16 and the frame 14 can be easily detached from each other by operating the engagement portion 40. For example, if the engagement portion 40 is disengaged, the cover 16 can be easily detached from the frame 14, and an inspection, a repair, etc., of an electronic component covered with the shield case 10 such as the CPU 100 can be easily carried out.

Here, if neither the groove 44 nor the groove contact 32 is provided, under the pressure from the heat-transfer member 50, the cover 16 may be easily deformed or an attachment state of the cover 16 may be changed. If the cover 16 is deformed, a contact state of the heat-transfer member 50 is weakened, and cooling efficiency is reduced, accordingly. Further, when the cover 16 is deformed or the attachment state of the cover 16 is changed, a contact resistance value in the engagement portion 40 becomes higher than it should be in some cases. Further, for example, if a distance between contact points shifts from a set value and becomes an integer multiple of a wavelength of electromagnetic waves, noise may leak from the shield case 10.

However, as described above, according to the structure of the present embodiment, the electronic component can be cooled and shielded excellently.

Second Embodiment

Figure 6A:
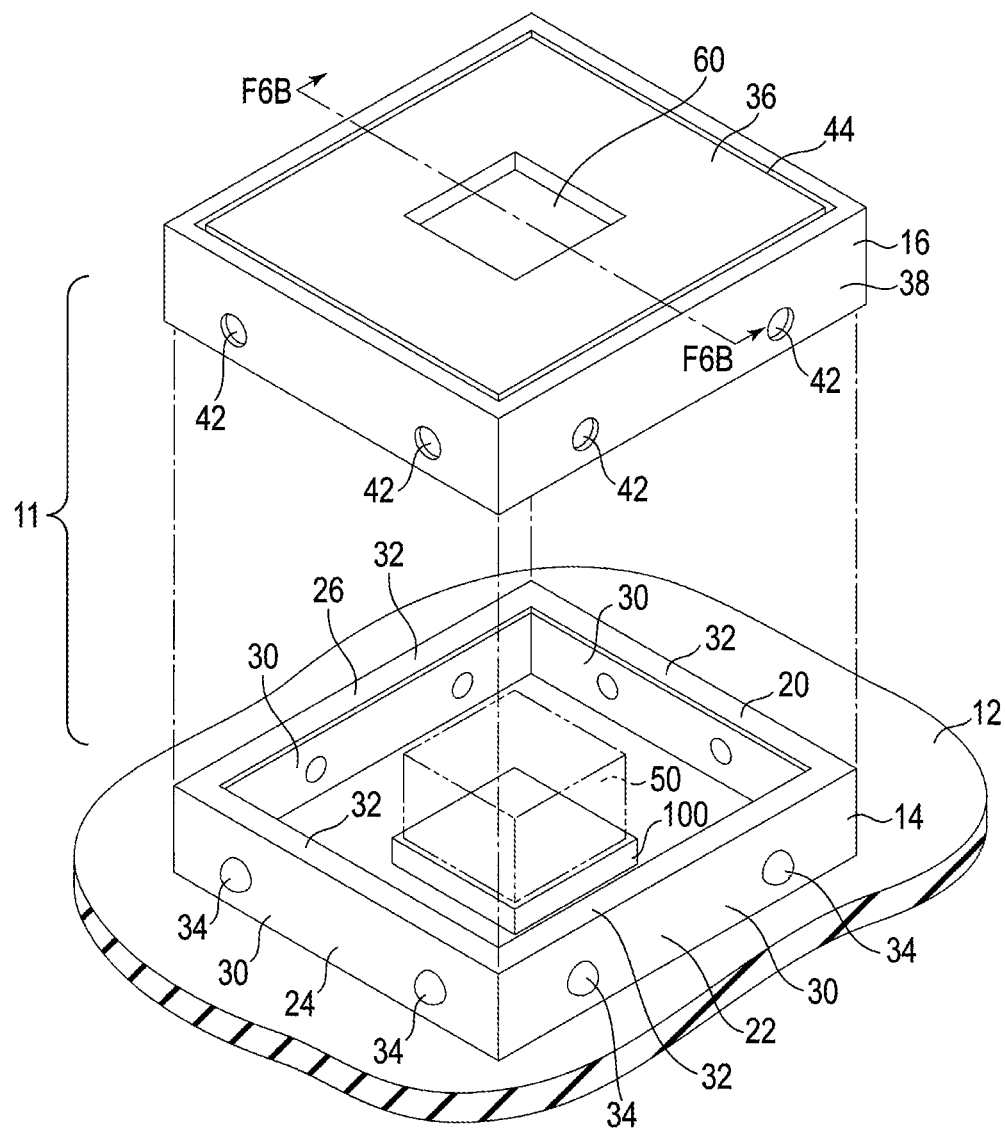
FIG. 6A is a perspective view of a shield case according to a second embodiment.
Figure 6B:
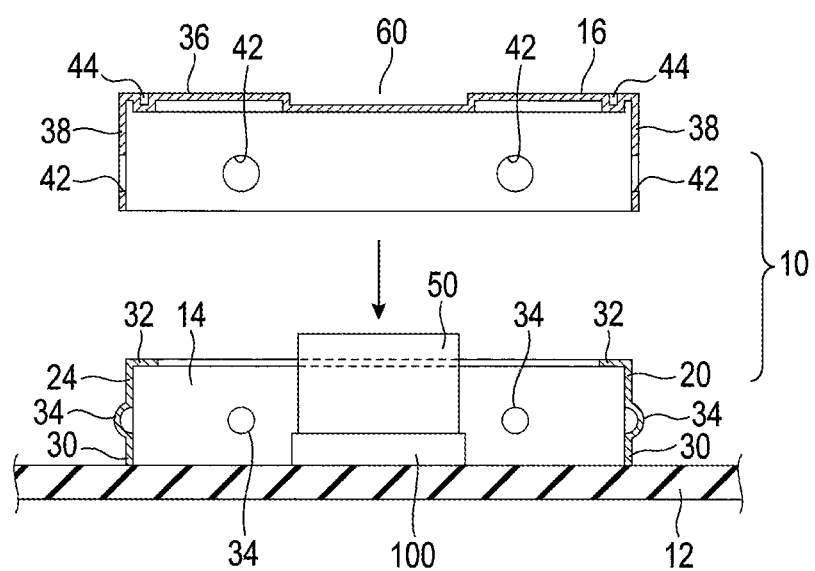
FIG. 6B is a sectional view of the shield case taken along section line F6B-F6B of FIG. 6A.

A shield case 11 of a second embodiment will be described. FIG. 6A is a perspective view of the shield case of the second embodiment when obliquely viewed from above. FIG. 6B is a sectional view of the shield case taken along section line F6B-F6B of FIG. 6A.

As shown in FIGS. 6A and 6B, the cover 16 of the shield case 11 has a recess portion 60 at a central portion. The other structure of the shield case 11 is the same as the structure of the shield case 10 of the first embodiment, and the same structural members are denoted by the same reference numbers and the descriptions are substituted.

The recess portion 60 is provided substantially at the center of the top plate 36 in such a manner as to correspond to the position of the heat-transfer member 50 attached to the CPU 100 in planar view. Viewed from the top, the recess portion 60 has a rectangular shape and sags toward the CPU 100.

The recess portion 60 has the same shape as or has a larger area than the heat-transfer member 50 in planar view. When the cover 16 is attached to the frame 14, a lower surface of the recess portion 60 contacts the heat-transfer member 50 and is subjected to predetermined pressure from the heat-transfer member 50.

According to the shield case 11 of the second embodiment, since the top plate 36 sags downward in the center by the recess portion 60, stiffness of the top plate 36 improves. Therefore, as in the case of the shield case 10 of the first embodiment, the shield case 11 is always subjected to heat as well as pressure from the heat-transfer member 50, but as compared to the shield case 10 of the first embodiment, the deformation of the top plate 36 can be further reduced.

Therefore, according to the shield case 11, the heat-transfer effect by the heat-transfer member 50 is increased, and the heat radiation characteristics of the CPU 100 are improved, and thus the CPU 100 can be cooled more excellently. Further, according to the shield case 11, since the deformation of the top plate 36 is prevented, all the engagement portions 40 of the shield case 11 can evenly and securely engage the cover 16 and the frame 14 with each other, and a high shield effect can also be realized.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A shield case comprising:
  a frame configured to surround an electronic component and comprising a contact portion at a top of the frame; and
  a cover comprising a side plate and a top plate, a groove being formed at a peripheral portion of the top plate, wherein the side plate is outside the frame and the groove contacts the contact portion when the cover is engaged with the frame, and the groove is formed along a whole peripheral portion of the top plate.

2. The shield case of claim 1, further comprising:
  first engagement members provided in the frame; and
  second engagement members provided in the side plate of the cover, the first engagement members engaging the second engagement members.

3. The shield case of claim 2, wherein
  the first engagement members comprise projections and the second engagement members comprise holes or recesses.

4. The shield case of claim 2, wherein
  the first engagement members comprise holes or recesses and the second engagement members comprise projections.

5. The shield case of claim 1, wherein the frame and the cover are formed of metal.

6. The shield case of claim 1, wherein
  a heat-transfer member having elasticity and provided on the electronic component, and
  the top plate of the cover contacts the heat-transfer member when the cover is engaged with the frame.

7. The shield case of claim 2, wherein
  a heat-transfer member having elasticity and provided on the electronic component,
  the top plate of the cover contacts the heat-transfer member when the cover is engaged with the frame, and
  a compressed stress from the heat-transfer member is applied to the first engagement members and the second engagement members.

8. The shield case of claim 1, wherein
  the cover is engaged with the frame at a position determined by the heat-transfer member and the contact portion such that electromagnetic noise from the electronic component is blocked.

9. A shield case comprising:
a frame configured to surround an electronic component and comprising a contact portion situated along a top of the frame; and
a cover comprising a side plate and a top plate, a groove being formed along an entire peripheral portion of the top plate, wherein the side plate is outside the frame and the groove contacts the contact portion when the cover is engaged with the frame.

10. The shield case of claim 9, further comprising:
a first plurality of engagement members provided in the frame; and
a second plurality of engagement members provided in the side plate of the cover, the first plurality of engagement members engaging the second plurality of engagement members.

11. The shield case of claim 10, wherein
each of the first plurality of engagement members comprises a projection and each of the second plurality of engagement members comprises an aperture or recess to engage with a corresponding projection of one of the first plurality of engagement members.

12. The shield case of claim 10, wherein
each of the first plurality of engagement members comprises an aperture or recess and each of the second plurality of engagement members comprise a projection to engage with a corresponding aperture or recess the one of the first plurality of engagement members.

13. The shield case of claim 9 further comprising:
a heat-transfer member having elasticity and provided on the electronic component, the heat-transfer member being positioned to contact the top plate of the cover when the cover is engaged with the frame.

14. The shield case of claim 10 further comprising:
a heat-transfer member having elasticity and provided on the electronic component, the heat-transfer member contacting the top plate of the cover when the cover is engaged with the frame and applying a compressed stress to the first plurality of engagement members and the second plurality of engagement members.

15. The shield case of claim 9, wherein
the cover is engaged with the frame at a position determined by a heat-transfer member mounted on the electronic component and the contact portion so that electromagnetic noise from the electronic component is blocked.

* * * * *